US012345774B2

(12) United States Patent
Anyam et al.

(10) Patent No.: US 12,345,774 B2
(45) Date of Patent: Jul. 1, 2025

(54) METHODS AND APPARATUS TO DETECT AND DIAGNOSE FAULTS IN BUCK REGULATORS

(71) Applicant: Texas Instruments Incorporated, Dallas, TX (US)

(72) Inventors: Karthik Anyam, Bengaluru (IN); Preetam Charan Anand Tadeparthy, Bangalore (IN); Mayank Jain, Bangalore (IN); Dattatreya Baragur Suryanarayana, Bangalore (IN); Charan Hemanth Kumar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 159 days.

(21) Appl. No.: 18/227,149

(22) Filed: Jul. 27, 2023

(65) Prior Publication Data

US 2024/0310455 A1  Sep. 19, 2024

(30) Foreign Application Priority Data

Mar. 14, 2023  (IN) .............................. 202341016858

(51) Int. Cl.
*G01R 31/40* (2020.01)

(52) U.S. Cl.
CPC .................................... *G01R 31/40* (2013.01)

(58) Field of Classification Search
CPC ............................. G01R 31/40; G01R 19/165
USPC .................................... 324/764.01, 537, 500
See application file for complete search history.

(56) References Cited

U.S. PATENT DOCUMENTS

| 10,498,237 B1* | 12/2019 | Lin ....................... H02M 3/158 |
| 2022/0103074 A1* | 3/2022 | Cai ..................... H02M 3/1586 |
| 2023/0092655 A1* | 3/2023 | Cai ..................... H02M 3/1586 |
| | | 323/271 |

* cited by examiner

*Primary Examiner* — Giovanni Astacio-Oquendo
(74) *Attorney, Agent, or Firm* — Valerie M. Davis; Frank D. Cimino

(57) ABSTRACT

An example apparatus includes: a phase circuit configured to receive a pulse of a pulse width module (PWM) signal; provide, after receiving the pulse, an output voltage to a load; exhibit a fault; in response to the fault corresponding to a first category, transmit a first code voltage in a current sense (CS) signal; in response to the fault corresponding to a second category, transmit a reference voltage in the CS signal; receive, after transmission of the reference voltage, a tristate voltage in the PWM signal; and transmit, after receiving the tristate voltage, a second code voltage in the CS signal based on a type of the fault and the second category.

20 Claims, 11 Drawing Sheets

| | INITIAL RESPONSE: THERMAL ANALOG OUTPUT (TAO) | INITIAL RESPONSE: CURRENT SENSE (CS) | FINAL RESPONSE: TAO | FINAL RESPONSE: CS |
|---|---|---|---|---|
| DRAIN POWER VOLTAGE UNDER VOLTAGE (VDD UVLO) | NORMAL-TEMPERATURE MONITOR | LATCH TO LOW (0V) | NOT APPLICABLE (NA) | NA |
| INPUT VOLTAGE UNDER VOLTAGE (VIN UVLO) OR OVER TEMPERATURE (OT) | SET HIGH (> 2.4V) | TRANSITION TO REFIN(1.5V) AND STAY AT REFIN UNTIL THE PWM IS AT TRISTATE | NORMAL-TEMPERATURE MONITOR | LATCH TO LOW |
| OVER CURRENT (OC) | SET HIGH (> 2.4V) | TRANSITION TO REFIN(1.5V) AND STAY AT REFIN UNTIL THE PWM IS AT TRISTATE | NORMAL-TEMPERATURE MONITOR | LATCH TO HIGH |
| HIGH SIDE SHORT (HSS) | SET HIGH (> 2.4V) | LATCH TO HIGH (3.3V) | NA | NA |

FIG. 3

METHODS AND APPARATUS TO DETECT AND DIAGNOSE FAULTS IN BUCK REGULATORS

RELATED APPLICATION

This patent application claims the benefit of and priority to Indian Provisional Patent Application Serial No. 202341016858 filed Mar. 14, 2023, which Application is hereby incorporated herein by reference in its entirety.

TECHNICAL FIELD

This description relates generally to buck regulators and, more particularly, to methods and apparatus to detect and diagnose buck regulators.

BACKGROUND

Power management is a critical design component of any electronic device. In general, power management circuitry refers to hardware within an electronic device that converts a first amount of power received from a source into a second amount of power that is consumable by a load within the electronic device. Power sources may include, but are not limited to, 120 voltage alternating current (VAC) or 240 VAC outlets, batteries, generators, solar energy from the sun, etc. Generally, power management circuitry may additionally convert the power from a first type (e.g., alternating current (AC)) to a second type (e.g., direct current (DC)) that is usable by the load.

SUMMARY

For methods and apparatus to detect and diagnose buck regulators, an example apparatus includes a phase circuit configured to receive a pulse of a pulse width module (PWM) signal; provide, after receiving the pulse, an output voltage to a load; exhibit a fault; in response to the fault corresponding to a first category, transmit a first code voltage in a current sense (CS) signal; in response to the fault corresponding to a second category, transmit a reference voltage in the CS signal; receive, after transmission of the reference voltage, a tristate voltage in the PWM signal; and transmit, after receiving the tristate voltage, a second code voltage in the CS signal based on a type of the fault and the second category.

BRIEF DESCRIPTION OF THE DRAWINGS

FIG. 3 is a table describing example operations performed by the phase circuit of FIG. 2 in response to detection of a fault.

The same reference numbers or other reference designators are used in the drawings to designate the same or similar (functionally and/or structurally) features.

DETAILED DESCRIPTION

Figure 1:
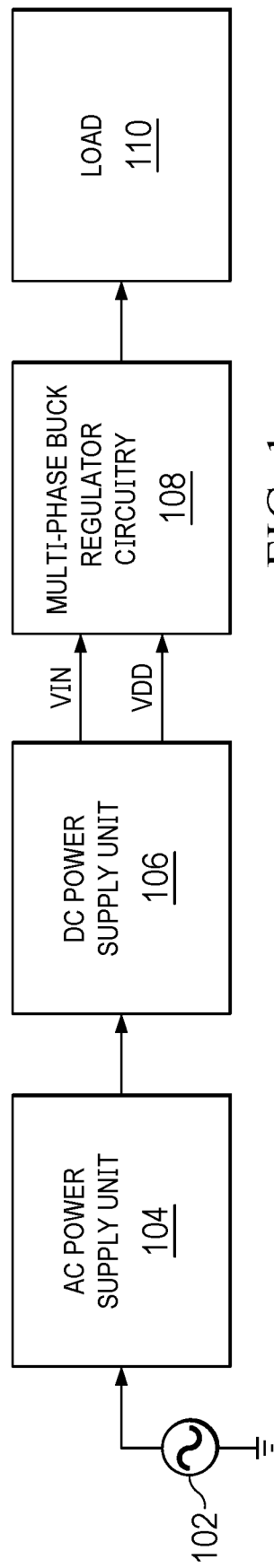
FIG. 1 is an example of power delivery that includes buck regulator circuitry.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Power management circuitry can refer to a wide variety of circuit architectures that implement different functionalities. One such example is voltage regulators. Voltage regulators refer to a category of circuit architectures designed to provide a constant voltage to a load. One example implementation of a voltage regulator is a buck regulator, which is designed to accept a first DC voltage from a supply and output a second DC voltage to a load that is a lower voltage than the first DC voltage. Buck regulator circuits also output the second DC voltage at an increased current relative to the first DC voltage. In some examples, buck regulators are referred to as buck converters.

Buck regulator circuits generally include, at a minimum, an inductor and a set of switches rated for high current and high voltage applications (e.g., a power metal-oxide-semiconductor field-effect transistor (MOSFET)). In some examples, an inductor and the corresponding power MOSFETs are referred to as either a power stage circuit or a phase circuit.

Generally, buck regulator circuits were traditionally implemented using single-phase designs. In such a design, one inductor and the corresponding power MOSFETs provide all the power required by the load. However, the increasing complexity and functionality of electronic devices has led to loads requiring larger amounts of power than previous generations of devices. In response, industry members have developed and adopted multi-phase buck regulator circuits having multiple inductors and multiple sets of corresponding power MOSFETs. Multi-phase buck regulator circuits can provide high power signals to a load while exhibiting reduced input capacitance, reduced output capacitance, improved thermal performance, and improved transient response in comparison to single-phase buck regulator circuits. In a multi-phase buck regulator architecture, a controller circuit sends pulses to one or more phases, enabling the one or more phases to concurrently provide a desired voltage and a desired current to a load.

The performance of a buck regulator is dependent on the thermal conditions of the phase circuits. Accordingly, many phase circuits are configured to repeatedly transmit temperature information to the controller circuit. In some implementations of a multi-phase buck regulator, each phase circuit provides their temperature information to the controller over a single communication channel that is shared with the other phase circuits.

Under normal operations, the thermal data may be low priority and/or small enough in size such that a single communication channel is proper. However, a phase circuit may experience a fault due to a change in operating or environmental conditions. The fault can cause a rise in the temperature that, in some cases, is severe enough to cause damage to the circuit if left unattended.

The presence of a fault on a phase circuit can cause the phase circuit to output different temperature information, thereby alerting the controller circuit. However, in some multi-phase buck regulators, the use of a single communication channel prevents the controller circuit from determining which phase circuit is exhibiting the fault. Furthermore, a change in temperature information would indicate a fault exists with the phase circuit but would not describe the type of fault exhibited by the phase circuit.

In some use cases, the lack of information regarding the type of fault provided to the controller circuit causes extreme preventive measures. Such measures may include turning the entire multi-phase buck regulator circuit off in case the faults are severe and damage to the board was imminent. Once the circuit is off, a human operator may then be required to physically go to the circuit and manually probe and/or troubleshoot the board. Through troubleshooting, the human operator may determine which phase circuit exhibited the fault, what type of fault occurred, and how to correct the fault. However, such preventative measures may result in long periods where the buck regulator circuit is not in operation. Furthermore, the process of a human operator manually accessing and troubleshooting a circuit is timely, expensive, and scales poorly.

Example methods, apparatus, and systems describe a multi-phase buck regulator circuit with a controller circuit configured to, in the event of a fault, determine which phase circuit exhibited the fault and determine what type of fault occurred. An example controller circuit obtains fault information for multiple phase circuits through both a shared thermal analog output (TAO) pin and a set of current sense (CS) pins (one per phase circuit). A given example phase circuit is configured to change the voltage of the shared TAO pin and/or the individual CS pin to pre-determined, non-operational voltages based on the type of fault. The example controller circuit then determines the location of the fault and the type of fault based on which pins have non-operational voltages and the value of said voltages. In some examples, the controller circuit performs preventative actions based on the obtained fault information.

FIG. 1 is an example of power delivery that includes buck regulator circuitry. FIG. 1 includes a power source 102, an AC power supply unit 104, a DC power supply unit 106, multi-phase buck regulator circuitry 108, and a load 110.

The power source 102 provides AC power. The power source 102 may be implemented by any device providing electrical energy in AC. For example, in FIG. 1, the example power source 102 is implemented by a 120 VAC outlet.

The AC power supply unit 104 transforms the 120 VAC into a different AC signal that is operable upon by the DC power supply unit. In particular, the AC power supply unit 104 may alter one or more of the voltage, frequency, shape of signal, number of phases, etc., depending on the type of the power source 102 and the requirements of the DC power supply unit.

The DC power supply unit 106 transforms the AC signal received from the AC powers supply unit 104 into a DC signal. The DC power supply unit 106 includes rectifier circuitry and filter circuitry to convert the AC signal to a DC signal. The DC power supply unit 106 is configured to provide a DC signal at a voltage that is operable by the multi-phase buck regulator circuitry 108. In some examples, the DC power supply unit 106 is referred to as a voltage source.

As described below, the example multi-phase buck regulator circuitry 108 is a voltage regulator circuit that transforms, in accordance with the teachings of this disclosure, the first DC voltage provided by the example DC power supply unit 106 into a second DC voltage usable by the load 110. The example multi-phase buck regulator circuitry 108 is discussed further in connection with FIG. 2.

In FIG. 1, the example load 110 is processor circuitry that uses the power from the second DC voltage to perform operations. In other examples, the load that receives the second DC voltage is another form of circuitry, including but not limited to a transceiver, volatile memory, etc. The example processor circuitry of load 110 may be implemented by any type of programmable circuitry such as programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs).

Figure 2:
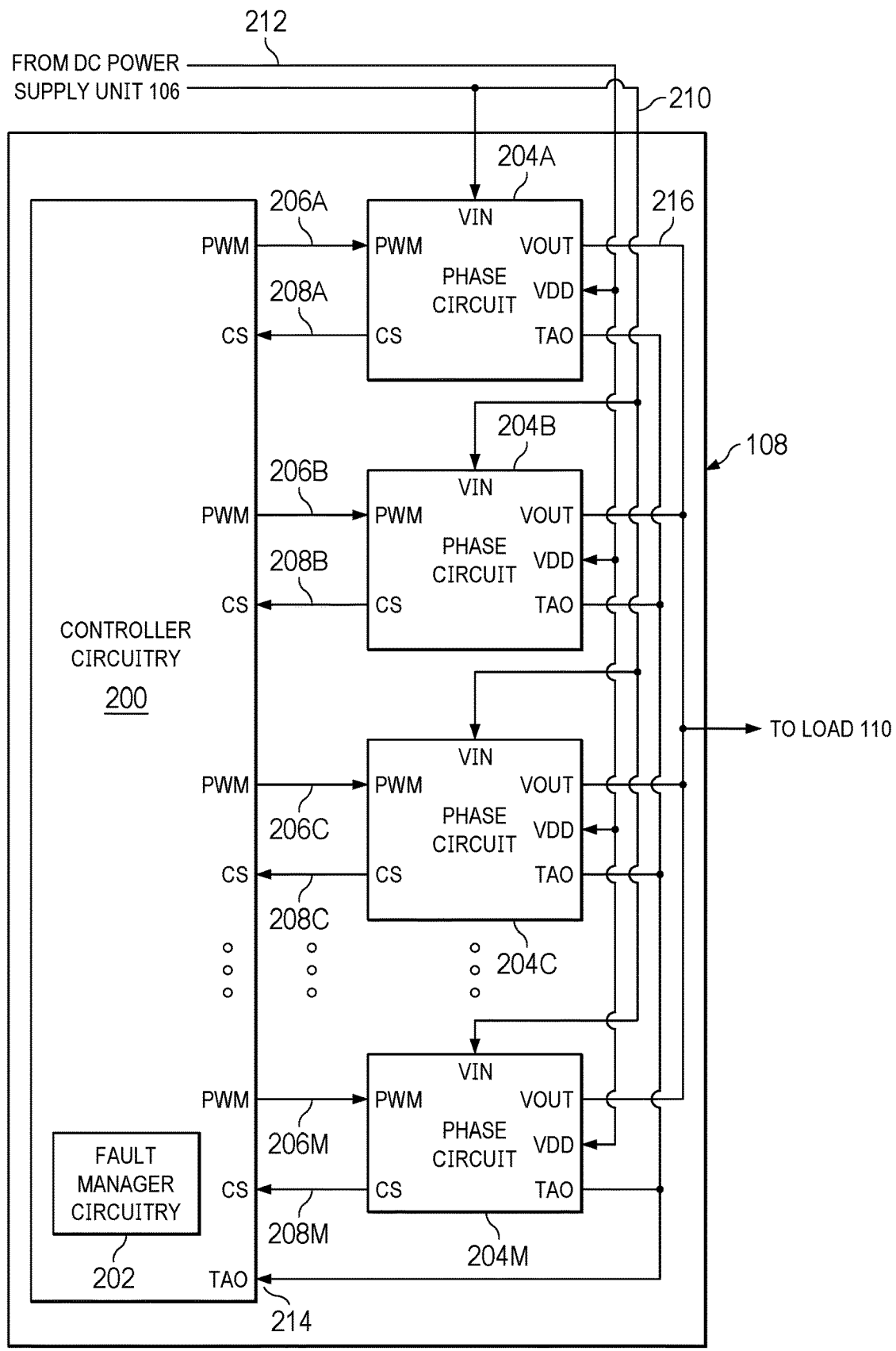
FIG. 2 is an example block diagram of the multi-phase buck regulator circuitry of FIG. 1.

FIG. 2 is a block diagram of an example implementation of the multi-phase buck regulator circuitry 108 of FIG. 1 to provide a voltage to a load. The multi-phase buck regulator circuitry 108 of FIG. 2 may be instantiated (e.g., creating an instance of, bring into being for any length of time, materialize, implement, enabled, etc.) by programmable circuitry such as a Central Processor Unit (CPU) executing first instructions. Additionally or alternatively, the multi-phase buck regulator circuitry 108 of FIG. 2 may be instantiated (e.g., creating an instance of, bring into being for any length of time, materialize, implement, enabled, etc.) by (i) an Application Specific Integrated Circuit (ASIC) and/or (ii) a Field Programmable Gate Array (FPGA) structured and/or configured in response to execution of second instructions to perform operations corresponding to the first instructions. It should be understood that some or all of the circuitry of FIG. 2 may, thus, be instantiated at the same or different times. Some or all of the circuitry of FIG. 2 may be instantiated, for example, in one or more threads executing concurrently on hardware and/or in series on hardware. Moreover, in some examples, some or all of the circuitry of FIG. 2 may be implemented by microprocessor circuitry executing instructions and/or ASIC or FPGA circuitry performing operations to implement one or more virtual machines and/or containers. In the example implementation of FIG. 2, the multi-phase buck regulator circuitry 108 includes controller circuitry 200, phase circuits 204A, 204B, . . . 204M (collectively referred to as phase circuits 204), pulse width module (PWM) signals 206A, 206B, . . . , 206M (collectively referred to as PWM signals 206), CS signals 208A, 208B, . . . , 208M, (collectively referred to as CSP signals 208), a voltage input (VIN) signal 210, a voltage drain (VDD) signal 212, a TAO signal 214, and a voltage output (VOUT) signal 216. The controller circuitry 200 includes fault manager circuitry 202.

Within the controller circuitry 200, the fault manager circuitry 202 identifies the location and type of phase circuit faults in accordance with the teachings of this disclosure. The fault manager circuitry 202 identifies when the voltage of the TAO signal 214 moves outside of a threshold range, which corresponds to a fault. The fault manager circuitry 202 then monitors the CS signals 208 for non-operational voltages and transmits pre-determined pulse sequences to one or more of the phase circuits 204. The location and type of fault arc determinable based on which CS signals 208 change and what values the CS signals 208 change to. The fault manager circuitry 202 is discussed further in connection with FIGS. 3-10.

Each of the phase circuits 204 receives a constant input voltage from the example DC power supply unit 106 and one of the PWM signals 206 from the controller circuitry 200. Upon receiving a pulse in the corresponding PWM signal 206A, a phase circuit 204A increases the current and decreases the voltage of the VOUT signal 216. To perform the voltage and current transformation, each of the example phase circuits 204 may include an inductor and one or more switches rated for high power. If a fault occurs, the phase circuit 204A that exhibited the fault is configured to communicate with the fault manager circuitry 202 in pre-determined sequences, thereby transmitting location and type information. In some examples, one or more of the phase circuits 204 are instantiated by programmable circuitry executing phase instructions and/or configured to perform operations such as those represented by the flowchart of FIG. 6.

The PWM signals 206 describe a set of communication channels with n output terminals on the controller circuitry 200 and one input terminal on each of the n phase circuits 204. The controller circuitry 200 transmits the PWM signals 206 to the phase circuits 204 respectively. A given PWM signal includes pulses (e.g., a transition from a low supply voltage to a high supply voltage and back to a low supply voltage) that, when received by a phase circuit, causes the phase circuit to temporarily increase the current and provide power to the load 110 through an output voltage (VOUT) signal.

The controller circuitry 200 uses the PWM signals 206 to adjust the voltage and/or current of the VOUT signal 216 based on the type of load 110. For example, suppose one or more components from the example environment 100 are implemented within a laptop. The controller circuitry 200 may cause the phase circuits 204 to provide more power in the VOUT signal 216 when the laptop is in an active state (e.g., lid open and with several applications running) then when the laptop is in a sleep state (e.g., lid closed with several applications closed or idle). The controller circuitry 200 may be implemented by any type of programmable circuitry. In some examples, the controller circuitry 200 is instantiated by programmable circuitry executing controller instructions and/or configured to perform operations such as those represented by the flowcharts of FIGS. 4-5.

The CS signals 208 describe a set of communication channels with n output terminals on each of the n phase circuits 204 and n input terminals on the controller circuitry 200. During normal operation (i.e., operation without faults), a given phase circuit 204A sets a CS signal 208A to an analog voltage proportional to the current flowing through the phase circuit 204A.

The VIN signal 210 represents the input voltage provided to each of the phase circuit 204 by the DC power supply unit 106. The phase circuits 204 convert the VIN signal 210 to the VOUT signal 216 based on the requirements of the load 110.

Figure 4:
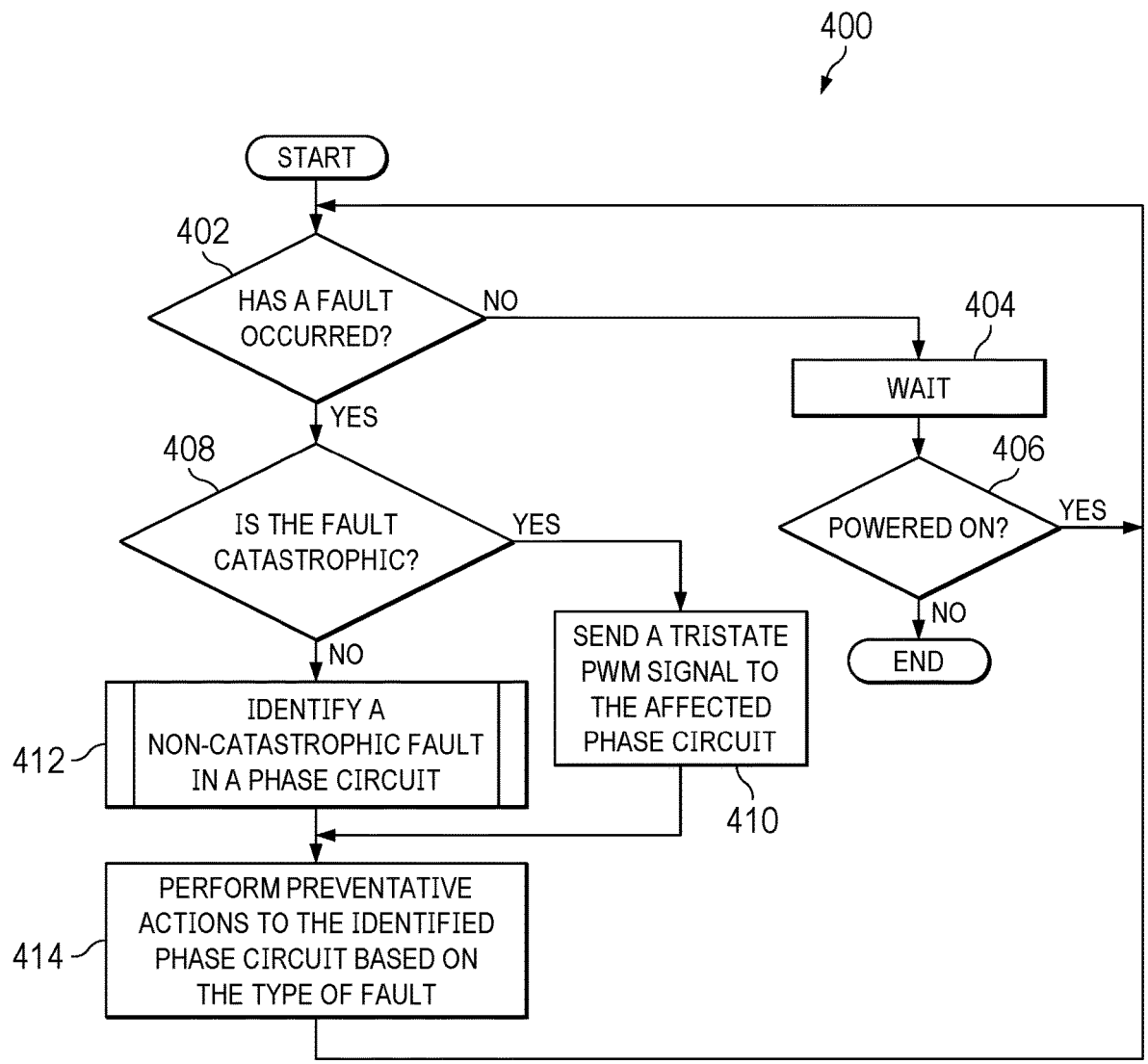
FIG. 4 is a flowchart representative of example machine readable instructions and/or example operations that may be executed, instantiated, and/or performed using an example programmable circuitry implementation of the controller circuitry of FIG. 2.

The VDD signal 212 represents the supply voltage provided to each of the phase circuits 204 by the DC power supply unit 106. The VDD signal 212 is used to bias transistors that implement the one or more switches in the phase circuits 204. In the example of FIG. 4, the DC power supply unit 106 provides the same input voltage to each of the phase circuits 204 via the VDD signal 212. In other examples, the DC power supply unit 106 provides different input voltages to different phase circuits.

The TAO signal 214 describes a communication channel with one input terminal on the controller circuitry 200 and one output terminal on each of the phase circuits 204. The communication channel may be implemented by a wire, interconnect, or any other suitable transmission medium for data transfer. The TAO signal 214 provides an analog voltage that is proportional to the collective temperature of the phase circuits 204. The TAO signal 214 does not contain information describing the variances in temperature between any two of the phase circuits 204. Rather, the fault manager circuitry 202 uses the TAO signal 214 to indicate whether at least one fault is present with one or more of the phase circuits 204. For example, the controller circuitry 200 identifies a fault has occurred when the voltage on the TAO signal 214 moves outside a threshold range. The fault manager circuitry 202 continues to work to locate the fault(s), identify the type of fault(s), and correct the fault(s) until the TAO signal moves back within the threshold range (indicating the fault has been resolved).

The VOUT signal 216 represents the signal output by the phase circuits 204 and provided to the load 110. The VOUT signal 216 has a lower voltage and a higher current than the VDD signal. The precise relationship between the VDD signal 212 and the VOUT signal 216 is based on the type of load 110 as described above.

FIG. 3 is a table describing example operations performed by the phase circuit of FIG. 2 in response to detection of a fault. FIG. 3 includes rows 302A, 302B, 302C, 302D (collectively referred to as rows 302), and columns 304A, 304B, 304C, 304D (collectively referred to as columns 304). In examples described herein, the phase circuit 204A exhibits a fault and is referred to as the affected phase circuit. In other examples, one of the other phase circuits 204B . . . 204M exhibits a fault. Additionally, in some examples, one or more phase circuits 204A, 204B, . . . , 204M experience multiple faults concurrently.

The rows 302 describe different types of faults. In general, a fault may be categorized, for example, as catastrophic or non-catastrophic. A catastrophic fault is a category of faults that requires immediate preventive action to stop or mitigate damage occurring to the multi-phase buck regulator circuitry 108 and/or load 110. In contrast, a non-catastrophic fault refers to any situation in which one or more phase circuits 204 exhibit unexpected behavior, but the behavior does not jeopardize the performance or safety of the rest of the multi-phase buck regulator circuitry 108.

Row 302A is a type of catastrophic fault where the VDD signal 212 provided to one or more of the phase circuits 204 drops below an operational voltage threshold. In some examples, a signal that drops below an operational voltage threshold is referred to as under voltage. If the VDD signal 212 exhibits undervoltage, the switches within the affected phase circuit(s) will be unable to operate in the conversion of the VIN signal 210 to the VOUT signal 216. The VDD signal 212 exhibiting undervoltage is catastrophic because the incorrect voltage may damage the multi-phase buck regulator circuitry 108. The VDD signal 212 may exhibit the under voltage for any reason.

Row 302B are two types of non-catastrophic faults. In the first type, the VIN signal 210 provided to one or more phase circuits 204 exhibits under voltage. In the second type, the temperature value of a phase circuit 204A exceeds a threshold. Row 302C is a third type of non-catastrophic fault in which the current flowing through a phase circuit 204A exceeds a threshold.

Row 302D is another type of catastrophic fault in which a high side transistor within a phase circuit 204A exhibits an electrical short. When enabled during normal operation, a high side transistor within the phase circuit causes the VOUT signal 216 to be pulled to a high supply voltage. Accordingly, the fault in row 302D is referred to as a high side short (HSS) in examples herein. The HSS is catastrophic because the HSS can cause the VOUT signal 216 to rise unexpectedly, thereby damaging the multi-phase buck regulator circuitry 108 and/or load 110.

The columns 304 describe actions that are taken by the phase circuit after exhibiting one of the faults from the rows 302. For example, columns 304A, 304B show how the affected phase circuit 204A initially changes the TAO signal 214 and the CS signal 208A, respectively, before any response is received by the fault manager circuitry 202. Columns 304C, 304D show how the affected phase circuit 204A further changes the TAO signal 214 and the CS signal 208A, respectively, after receiving a response from the fault manager circuitry 202.

When a catastrophic fault occurs, the affected phase circuit 204A seeks to inform the controller circuitry 200 of the fault as quickly as possible to mitigate further damage. For example, the row 302A, column 304B shows that when the VDD signal 212 exhibits under voltage, the affected phase circuit 204A pulls the individual CS signal 208A to a low voltage (e.g., 0 V). Row 302A, column 304A shows the affected phase circuit 204A does not change the shared TAO signal 214 because the VDD under voltage can be identified with only the CS signal 208A changing to a low voltage. Row 302D, column 304A shows the affected phase circuit 204A immediately pulls the TAO signal 214 to a high voltage (e.g., a voltage greater than 2.4 V) to indicate a HSS fault that can raise the temperature of the circuit to dangerous levels. To self-identify as the location of the HSS fault, row 302D, column 304B shows the affected phase circuit 204A pulls the CS signal 208A to a high supply voltage (e.g., 3.3 V).

Advantageously, the phase circuits 204 are configured to communicate both the location and the type of catastrophic fault to the controller circuitry 200 without requiring intermediate response signals from the fault manager circuitry 202. As a result, the fault manager circuitry 202 has the information necessary to take preventative actions as soon as the TAO signal 214 and/or one of the CS signals 208 changes as described in columns 304A, 304B. Preventative actions to a catastrophic fault may include but are not limited to turning the entire multi-phase buck regulator circuitry 108 off, pulling one or more signals to ground, etc. The preventative action either fixes the underlying problem or prevents additional unexpected behavior from occurring. As such the fault manager circuitry 202 has no need to send a response back to the affected phase circuit 204A, and the phase circuit 204A has no need to change the TAO signal 214 or CS signal 208A further, when a catastrophic fault occurs. This is shown by <row 302A, column 304C>, <row 302A, column 304D>, <row 302D, column 304C>, and <row 302D, column 304D>all listing Not Applicable (NA) in FIG. 3.

When a non-catastrophic fault occurs, the affected phase circuit 204A first seeks to inform the controller circuitry 200 that fault has relatively low severity in comparison to a catastrophic fault. For example, column 304A and rows 302B and 302C show that the affected phase circuit 204A initially pulls the TAO signal 214 to a high supply voltage, regardless of the specific type of non-catastrophic fault. Similarly, column 304B and rows 302B and 302C show that the affected phase circuit 204A initially pulls the CS signal 208A to a reference input (REFIN) voltage (e.g., 1.5 V) regardless of the specific type of non-catastrophic fault. The affected phase circuit 204A keeps the CS signal 208A at the REFIN voltage until a response is received from the fault manager circuitry 202. The response from the fault manager circuitry 202 is a change in the corresponding PWM signal 206A. The response from the fault manager circuitry 202 is discussed further in connection with FIGS. 4, 7-10.

After receiving the response from the fault manager circuitry 202, <row 302B, column 304C>, and <row 302C, column 304C>indicate that the affected phase circuit 204A lets the TAO signal 214 revert to a normal voltage that represents the temperature of all phase circuits 204. Row 302B, column 304D shows the affected phase circuit 204A pulls the CS signal 208A to a low supply voltage (e.g., 0 V) if the VIN signal 210 exhibits under voltage or if the phase circuit 204A exceeded a temperature threshold. At row 302C, column 304D, the affected phase circuit 204A pulls the CS signal 208A to a high supply voltage. In some examples, the high supply voltages, low supply voltages, and REFIN voltages are referred to collectively as code voltages because they may be specific, pre-determined values that the fault manager circuitry 202 interprets as a code to determine fault information.

While each of the non-catastrophic faults in rows 302B and 302C may cause unexpected behaviors from the affected phase circuit 204A if left unattended, none of the faults by themselves are likely to affect the performance of the rest of the multi-phase buck regulated circuitry 108. Accordingly, once the fault manager circuitry 202 identifies a fault as a non-catastrophic type and identifies the location, the fault manager circuitry 202 may take preventative action to just the affected phase circuit (e.g., phase circuit 204A) while leaving the rest of the phase circuits 204 to operate normally.

An affected phase circuit 204A can only communicate with the controller circuitry 200 using the individual CS signal 208A or the shared TAO signal 214. Furthermore, while the example table of FIG. 3 shows five types of faults for simplicity, additional types of faults may occur in practice. Due to the limited number of communication channels and the wide variety of faults, in some examples, there may not be enough combinations of pre-determined voltages available to reliably identify and locate each type of unique fault that occurs in an initial response to the fault (e.g., in columns 304A and 304B alone). Advantageously, the phase circuits 204 and fault manager circuitry 202 are both configured to prioritize catastrophic fault information over non-catastrophic faults in the signal changes from the initial response (columns 304A and 304B). That is, the initial responses of rows 302A and 302D convey both location and type information for catastrophic information. In contrast, the initial responses of rows 302B and 302C only identify that a generic, non-catastrophic fault has occurred somewhere in the circuit. Through this manner, the fault manager circuitry 202 can take preventative actions to the most severe faults immediately, while also enabling preventative actions for lower priority faults later (i.e., once a response is sent in the PWM signal 206A and further communication with the affected phase circuit 204A occurs).

While an example manner of implementing the multi-phase buck regulator circuitry 108 of FIG. 1 is illustrated in FIG. 2, one or more of the elements, processes, and/or devices illustrated in FIG. 2 may be combined, divided, re-arranged, omitted, eliminated, and/or implemented in any other way. Further, the controller circuitry 200, the fault manager circuitry 202, the phase circuits 204A, 204B, . . . , 204M and/or, more generally, the multi-phase buck regulator circuitry 108 of FIG. 2, may be implemented by hardware alone or by hardware in combination with software and/or firmware. Thus, for example, any of the controller circuitry 200, the fault manager circuitry 202, the phase circuits 204A, 204B, . . . , 204M and/or, more generally, the multi-phase buck regulator circuitry 108 of FIG. 2, could be implemented by programmable circuitry in combination with machine readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example the multi-phase buck regulator circuitry 108 of FIG. 1 may include one or more elements, processes, and/or devices in addition to, or instead of, those illustrated in FIG. 2, and/or may include more than one of any or all of the illustrated elements, processes and devices.

Figure 5:
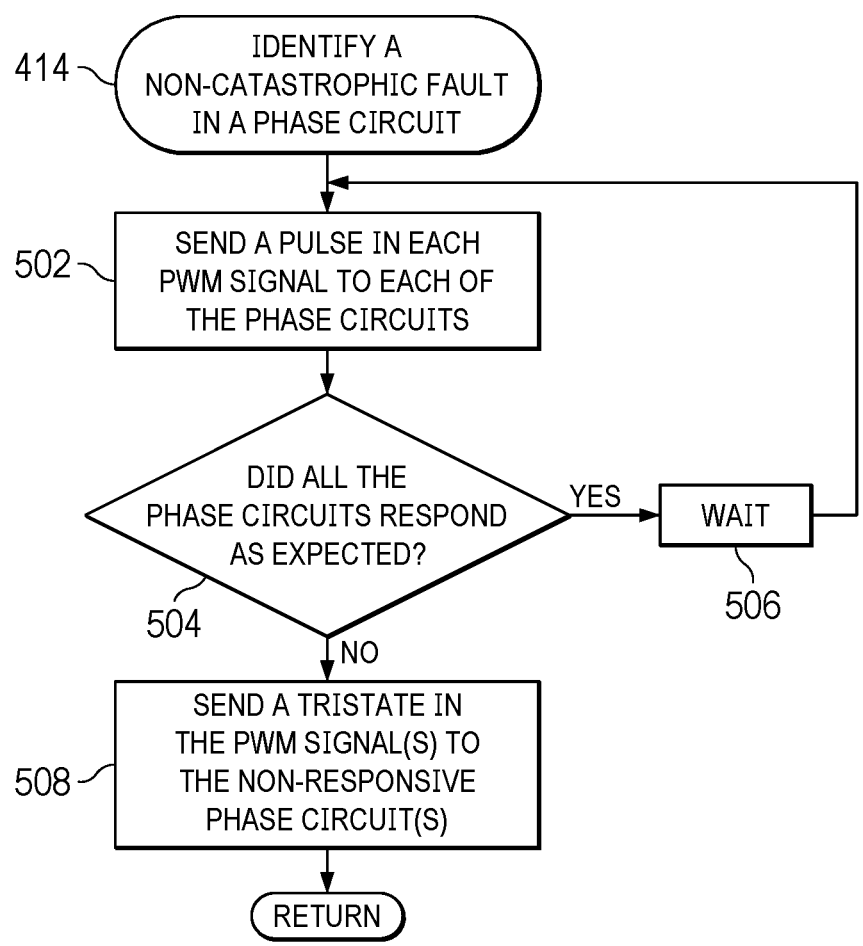
FIG. 5 is a flowchart representative of example machine readable instructions and/or example operations that may be executed, instantiated, and/or performed to identify a non-catastrophic fault in a phase circuit as described in connection with FIG. 4.
Figure 6:
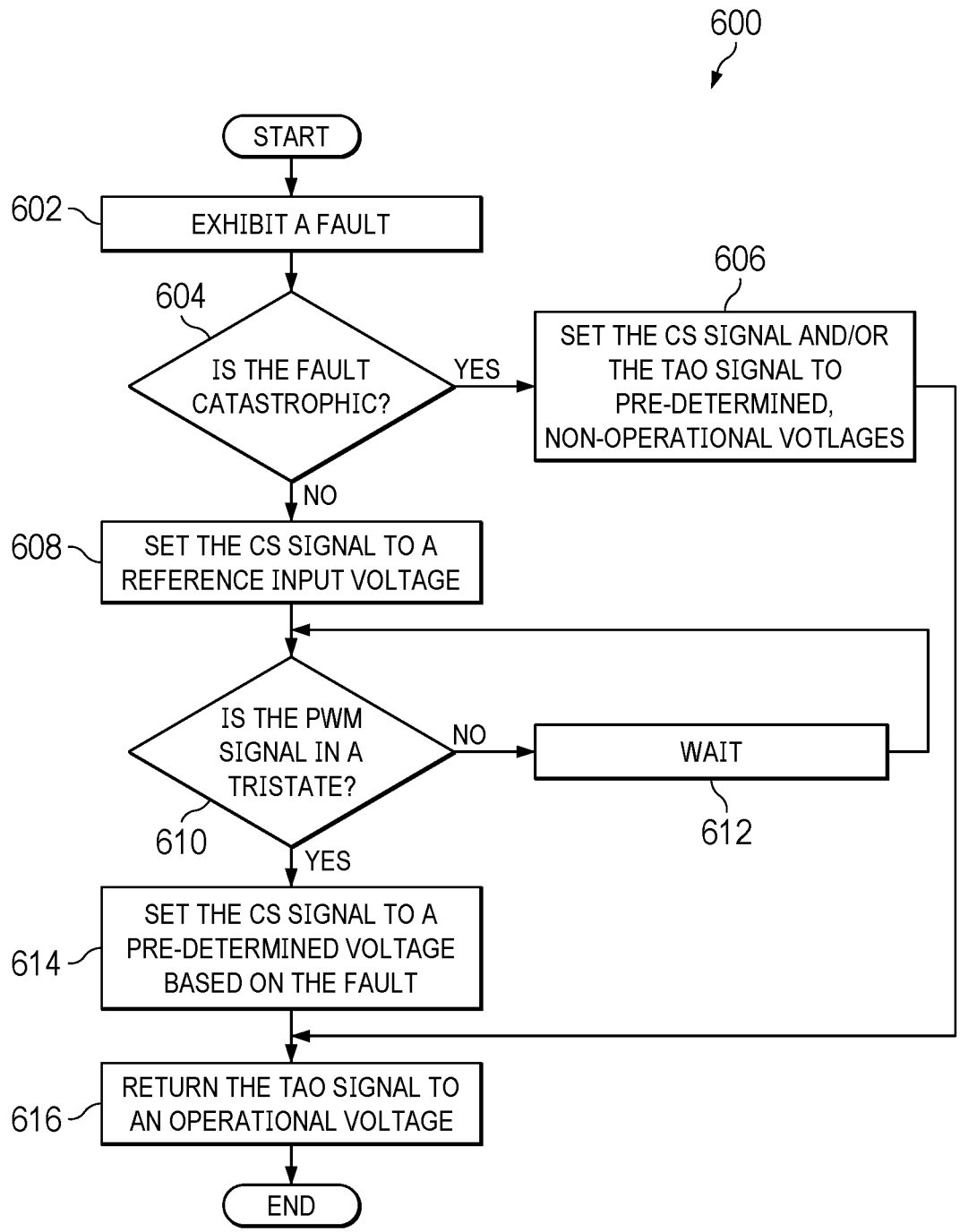
FIG. 6 is a flowchart representative of example machine readable instructions and/or example operations that may be executed, instantiated, and/or performed using an example programmable circuitry implementation of a phase circuit of FIG. 2.

Flowchart(s) representative of example machine readable instructions, which may be executed by programmable circuitry to implement and/or instantiate the multi-phase buck regulator circuitry 108 of FIG. 1 and/or representative of example operations which may be performed by programmable circuitry to implement and/or instantiate the multi-phase buck regulator circuitry 108 of FIG. 1, are shown in FIGS. 4, 5, 6. The machine readable instructions may be one or more executable programs or portion(s) of one or more executable programs for execution by programmable circuitry such as the programmable circuitry 1112 shown in the example programmable circuitry platform 1100 described below in connection with FIG. 11. In some examples, the machine readable instructions cause an operation, a task, etc., to be carried out and/or performed in an automated manner in the real world. As used herein, "automated" means without human involvement.

FIG. 4 is a flowchart representative of example machine readable instructions and/or example operations 400 that may be executed, instantiated, and/or performed by programmable circuitry to implement the fault manager circuitry 202. The example machine-readable instructions and/or the example operations 400 of FIG. 4 begin when the fault manager circuitry 202 determines whether a fault has occurred. (Block 402). The fault manager circuitry 202 identifies a fault has occurred if one or more of the TAO signal 214 or CS signals 208 exhibit a code voltage as described above in connection with columns 304A and 304B of FIG. 3. Similarly, a fault has not occurred if the voltage in the TAO signal 214 and the CS signals 208 remain at operational values for their intended functions (measuring temperature and current flow, respectively).

If a fault has not occurred (Block 402: No), the fault manager circuitry 202 waits an amount of time. (Block 404). After the wait period, the fault manager circuitry 202 determines if the multi-phase buck-regulator circuitry 108 is still powered on. (Block 406). If the multi-phase buck-regulator circuitry 108 is still powered on (Block 406: Yes), control returns to block 402 where the fault manager circuitry 202 performs a subsequent check for faults. If the multi-phase buck-regulator circuitry 108 is powered off (Block 406: No), the machine readable instructions and/or operations 400 end.

If a fault has occurred (Block 402: Yes), the fault manager circuitry 202 determines whether the fault is catastrophic (Block 408). As described above in connection with FIG. 3, the fault manager circuitry 202 analyzes the code voltages of the CS signals 208 to determine if the fault is catastrophic. For example, if the CS signal 208A is measured at a low code voltage (e.g., 0 V) or high code voltage (e.g., 3.3 V), the phase circuit 204A has exhibited either a VDD under voltage fault or a HSS fault, both of which are catastrophic. Alternatively, if the CS signal 208A is measured at the REFIN voltage, the phase circuit 204A has exhibited a non-catastrophic fault.

If the fault is catastrophic (Block 408: Yes), the fault manager circuitry 202 sends a tristate voltage in the PWM signal 206A of the affected phase circuit 204A. (Block 410). During normal operation, the digital PWM signals 206 include either a high supply voltage representing a logical '1' bit or a low supply voltage representing a logical '0' bit. As used above and herein, a tristate voltage refers to a pre-determined voltage in the PWM signals 206 that is not representative of a logical bit. The tristate voltage causes the affected phase circuit 204A to stop operations.

If the fault is non-catastrophic (Block 408: No), the fault manager circuitry 202 identifies the non-catastrophic in one of the phase circuits 204. (Block 412). In such examples, a tristate PWM signal is not sent before block 412 because the exact location of the non-catastrophic fault has not yet been determined. Furthermore, the fault manager circuitry 202 does not send tristate voltage in all of the PWM signals 206 before block 412 because such a response would be over-cautious for a non-catastrophic fault. During block 412, the fault manager circuitry 202 performs operations to identify both the location and type of the non-catastrophic fault. Block 412 is discussed further in connection with FIG. 5.

After either of blocks 410, 412, the fault manager circuitry 202 performs preventative actions to the identified phase circuit based on the type of fault. (Block 414). Preventative actions may include but are not limited to shutting down one or more of the phase circuits 204, shorting one or more signals to ground, notifying an external device, etc. In general, the severity of the preventive action based on the severity of the fault. After block 414, control returns to block 402 where the fault manager circuitry 202 performs a subsequent check for additional faults.

FIG. 5 is a flowchart representative of example machine readable instructions and/or example operations that may be executed, instantiated, and/or performed to identify a non-catastrophic fault in a phase circuit as described in connection with FIG. 4. Specifically, FIG. 5 describes example machine readable instructions and/or example operations to identify a non-catastrophic fault in a phase circuit as described in block 414 of FIG. 4.

Execution of block 414 begins when the fault manager circuitry 202 sends a pulse in each of the PWM signals 206 to each of the phase circuits 204. (Block 502). The pulses of block 502 may have the same properties (width, periodicity, etc.) as previous pulses sent before a non-catastrophic fault was identified. The phase circuit 204A sends a pulse in each of the PWM signals at block 502 rather than sending only one pulse to the phase circuit 204A identified in block 408 of FIG. 4. The additional pulses are transmitted because, in some examples, the conditions that cause one phase circuit 204A to exhibit a non-catastrophic fault may additionally cause one or more other phase circuits 204B, . . . , 204M to also exhibit a non-catastrophic fault. For instance, suppose the controller circuitry 200 uses the CS signals 208 and TAO signal 214 to identify the VOUT signal 216 is under voltage (a non-catastrophic fault). Suppose further that, in response, the controller circuitry 200 takes preventative action by sending pulses in the corresponding PWM signal to increase the current of the VOUT signal 216. In some examples, the transmitted pulses may inadvertently lead to an over-current condition (e.g., another non-catastrophic fault). Advantageously, the sending of a pulse in each of the phase circuits 204 enables the fault manager circuitry 202 to identify all faults before resuming normal operations.

The fault manager circuitry 202 determines if each of the phase circuits 204 responded as expected. (Block 504). During normal operations, the controller circuitry 200 expects a pulse in a given PWM signal 206A to cause an increase in the current flowing through the phase circuit 204A, thereby increasing the voltage of the corresponding CS signal 208A. Accordingly, an unexpected response in block 504 may include a CS signal 208A that does not change at all, decreases voltage, or increases voltage an amount different than anticipated.

If each of the phase circuits 204 respond as expected (Block 504: Yes), the fault manager circuitry 202 waits an amount of time (Block 506) before sending an additional set of pulses in a subsequent execution of block 502. The fault manager circuitry 202 continues in the foregoing loop because, in some examples, a phase circuit 204A can respond normally for a number of clock cycles after experiencing a non-catastrophic fault. However, a phase circuit experiencing a fault will eventually exhibit an unexpected response at 504. The unexpected response leads to identification and preventative action as described further below.

If at least one of the phase circuits 204 does not respond as expected (Block 504: No), the fault manager circuitry 202 provides a tristate voltage in the PWM signals of each phase circuits 204 that provided a missing or irregular response. (Block 508). The tristate voltage causes the affected phase circuit(s) to transition the CSP signals to a different code voltage as described in connection with column 304D of FIG. 3. Advantageously, by waiting to send the tristate voltage until the specific location of the non-catastrophic fault is identified, the fault manager circuitry 202 keeps the unaffected phase circuits 204 operating normally. The continued operation provides improved performance and efficiency over an approach that turns off all phase circuits 204 as soon as a fault is identified.

FIG. 6 is a flowchart representative of example machine readable instructions and/or example operations that may be executed, instantiated, and/or performed using an example programmable circuitry implementation of a phase of FIG. 2. While the following description is in reference to the phase circuit 204A, the flowchart of FIG. 6 may be implemented by each of the phase circuits 204. The example machine readable instructions and/or operations 600 begin when the phase circuit exhibits a fault. (Block 602). The fault may be any type, including but not limited to the types described in connection with FIG. 3.

The phase circuit 204A determines if the fault is catastrophic. (Block 604). The fault is categorizable as either catastrophic or non-catastrophic. The phase circuit 204A may categorize the fault based on severity and/or potential to cause damage to the multi-phase buck regulator circuitry 108. In some examples, the phase circuit 204A is pre-configured to categorize a first set of common conditions as catastrophic and a second set of common conditions as non-catastrophic.

If the phase circuit 204A determines the fault is catastrophic (Block 604: Yes), the phase circuit 204A sets the CS signal 208A and/or the TAO signal 214 to a pre-determined, non-operational voltage. (Block 606). The specific voltage values and specific signals are based on the type of catastrophic fault. For example, FIG. 3 shows the phase circuit 204A changes the CS signal 208A to a low supply voltage when a VDD under voltage fault occurs. FIG. 3 and to a high supply voltage when an HSS fault occurs. Furthermore, the phase circuit 204A does not adjust the TAO signal 214 for a VDD under voltage fault but does pull the TAO signal 214 to a high supply voltage for a HSS fault. Control proceeds to block 616 after block 606.

If the fault is non-catastrophic (Block 604: No), the phase circuit 204A sets the CS signal 208A to the REFIN voltage (Block 608). The REFIN voltage indicates to the fault manager circuitry 202 that a non-catastrophic fault has occurred.

The phase circuit 204A determines if the PWM signal 206A is at a tristate voltage. (Block 610). The tristate voltage is a pre-determined voltage that does not represent a digital bit. If the PWM signal 206A is not at a tristate voltage (Block 610: No), the phase circuit 204A waits an amount of time (Block 612) before control returns to block 610 and the phase circuit performs a subsequent check of the PWM signal 206A voltage.

If the phase circuit 204A is at a tristate voltage (Block 610: Yes), the phase circuit 204A sets the CS signal to a pre-determined code voltage based on the fault. (Block 614). For example, the affected phase circuit 204A latch the CS signal 208A to a low supply voltage at block 614 if the exhibited fault was a VIN under voltage or a temperature reading that exceeded a threshold. In other examples, the affected phase circuit 204A latches the CS signal 208A to a high supply voltage if the exhibited fault is an amount of current exceeding a threshold.

In examples where the affected phase circuit 204A sets the TAO signal 214 to a pre-determined code voltage at block 606, the affected phase circuit 204A returns the TAO signal 214 to an operational voltage. (Block 616). As used above and herein, an operational voltage of the TAO signal 214 refers to a voltage that represents the collective temperature of the phase circuits 204 (i.e., the function of the TAO pin during the normal operation). In contrast, the TAO signal 214 is not at an operational voltage when the pin is used to indicate a fault. In other examples, the TAO signal 214 remains at an operational voltage throughout the machine readable instructions and/or operations 600.

Figure 7:
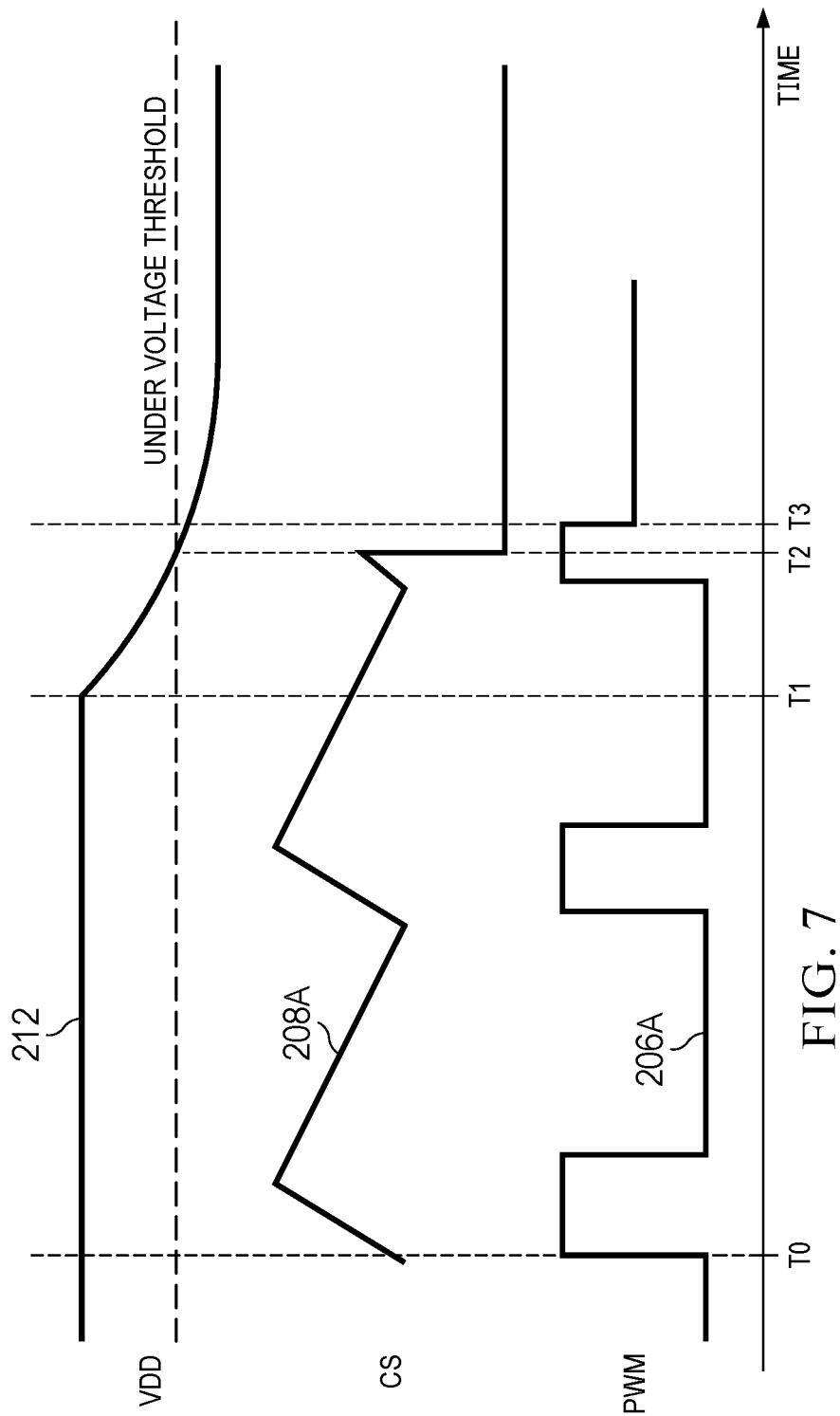
FIG. 7 is an example timing diagram representative of signals within the multi-phase buck regulator circuitry of FIG. 2 when a phase circuit exhibits a first catastrophic fault.

FIG. 7 is an example timing diagram representative of signals within the multi-phase buck regulator circuitry of FIG. 2 when an affected phase circuit 204A exhibits a first catastrophic fault. FIG. 7 includes the VDD signal 212, the CS signal 208A, and the PWM signal 206A. The timeline of FIG. 7 also includes timestamps T0, T1, T2, T3.

The time between T0 and T1 represent normal operations of the phase circuit 204A. In particular, the controller circuitry 200 sends pulses in the PWM signal 206A based on a set periodicity and/or the needs of the load 110. In response to detecting the rising edge of the signal, the phase circuit 204A provides an amount of power to the load 110. The power delivery requires the current in the phase circuit 204A to rise linearly for a period before returning to an operational amperage. Throughout the normal operations, the VDD signal 212 remains at a static voltage level.

At T1, the voltage of the VDD signal 212 (as measured at the input pin of the phase circuit 204A) begins to decrease. The VDD signal 212 may decrease for any reason, including but not limited to a broken component, improper signal routing, transient voltage drops, etc. At T2, the voltage of the VDD signal 212 decreases to less than the under voltage threshold, causing the irregular behavior to now be categorized as a catastrophic fault.

Advantageously, the phase circuit 204A is configured to send code voltages as soon as a catastrophic fault is identified. For example, after T2, the phase circuit 204A pulls the CS signal 208A to a low supply voltage (e.g., 0 V) in a near instantaneous manner (recognizing there may be real world delays for computing time, transmission of electrical signals within the phase circuit 204A, etc.). The low supply voltage works as a code because it is an identifiably smaller voltage than the range of voltages in the CS signal 208A between T0 and T1.

The fault manager circuitry 202 identifies the phase circuit 204A is exhibiting a VDD under voltage fault based on the voltage at the controller pin carrying the CS signal 208A dropping to the low supply voltage. At T3, the fault manager circuitry 202 changes the voltage of the PWM signal 206A to a tristate voltage to prevent the phase circuit 204A from continuing to convert the VIN signal 210 to the VOUT signal 216. The difference between T2 and T3 represents the time required for: (1) the voltage change in the CS signal 208A to travel from the phase circuit 204A to the controller circuitry 200, (2) the fault manager circuitry 202 to interpret the change, and (3) the fault manager circuitry 202 to change the PWM signal 206A in response to the interpretation.

The fault manager circuitry 202 takes preventative actions after T2 to mitigate damage and/or resolve the fault. In some examples, the tristate voltage in the PWM signal 206A is considered one form of preventative action.

Figure 8:
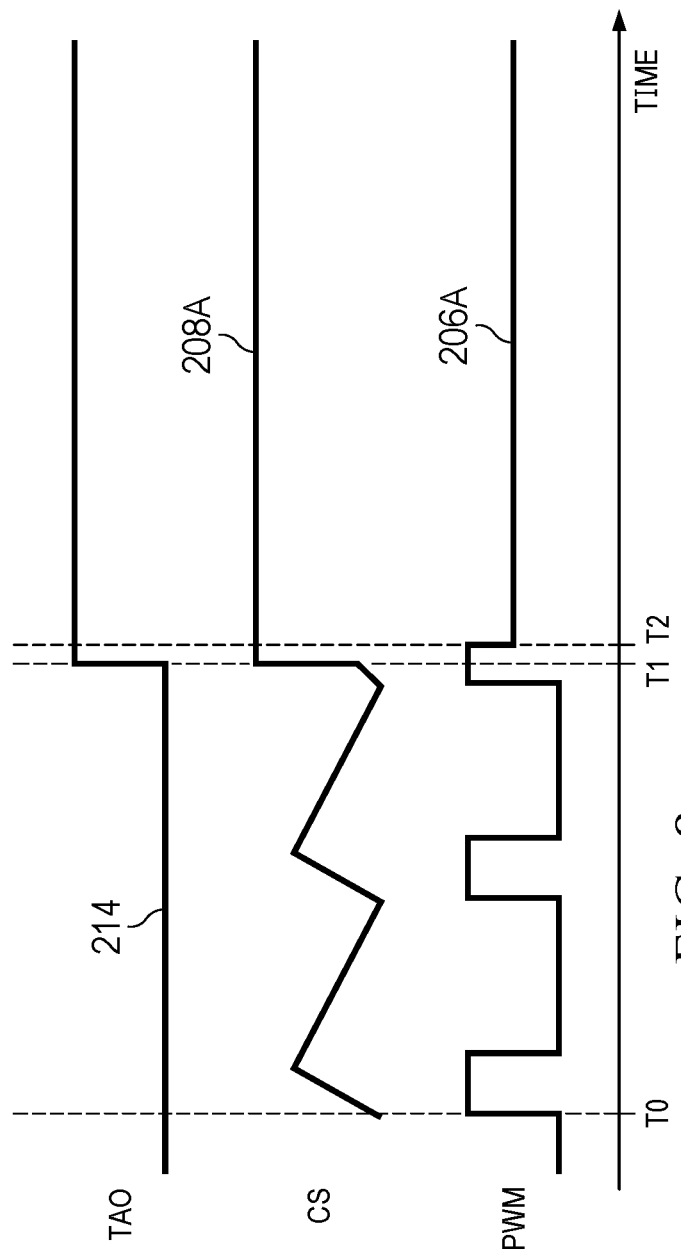
FIG. 8 is an example timing diagram representative of signals within the multi-phase buck regulator circuitry of FIG. 2 when a phase circuit exhibits a second catastrophic fault.

FIG. 8 is an example timing diagram representative of signals within the multi-phase buck regulator circuitry of FIG. 2 when an affected phase circuit 204A exhibits a second catastrophic fault. FIG. 8 includes the TAO signal 214, the CS signal 208A, and the PWM signal 206A. The timeline of FIG. 8 also includes timestamps T0, T1, T2. The timeline of FIG. 8 is separate from the timeline described above in connection with FIG. 7.

The time between T0 and T1 of FIG. 8 represent normal operations of the phase circuit 204A. In particular, the controller circuitry 200 sends pulses in the PWM signal 206A based on a set periodicity and/or the needs of the load 110. In response to detecting the rising edge of the signal, the phase circuit 204A provides an amount of power to the load 110. The power delivery requires the current in the phase circuit 204A to rise linearly for a period before returning to an operational amperage. Throughout the normal operations, the TAO signal 214 remains at an operational voltage level representative of the temperature of all phase circuits 204.

At T1 in FIG. 8, an HSS fault occurs. The HSS fault may occur for any reason, including but not limited to damage within the high side transistor within the affected phase circuit 204A.

Advantageously, the phase circuit 204A is configured to send code voltages as soon as a catastrophic fault is identified. For example, after T1 in FIG. 8, the phase circuit 204A pulls the CS signal 208A to a high supply voltage (e.g., 3.3 V) in a near instantaneous manner (recognizing there may be real world delays for computing time, transmission of electrical signals within the phase circuit 204A, etc.). The low supply voltage works as a code because it is an identifiably larger voltage than the range of voltages in the CS signal 208A between T0 and T1.

The fault manager circuitry 202 identifies the phase circuit 204A is exhibiting a VDD under voltage fault based on the voltage at the controller pin carrying the CS signal 208A rising to the high supply voltage. At T2 in FIG. 8, the fault manager circuitry 202 changes the voltage of the PWM signal 206A to a tristate voltage to prevent the phase circuit 204A from continuing to convert the VIN signal 210 to the VOUT signal 216. The difference between T1 and T2 represents the time required for: (1) the voltage change in the CS signal 208A to travel from the phase circuit 204A to the controller circuitry 200, (2) the fault manager circuitry 202 to interpret the change, and (3) the fault manager circuitry 202 to change the PWM signal 206A in response to the interpretation.

The fault manager circuitry 202 takes preventative actions after T1 of FIG. 8 to mitigate damage and/or resolve the fault. In some examples, the tristate voltage in the PWM signal 206A is considered one form of preventative action.

Figure 9:
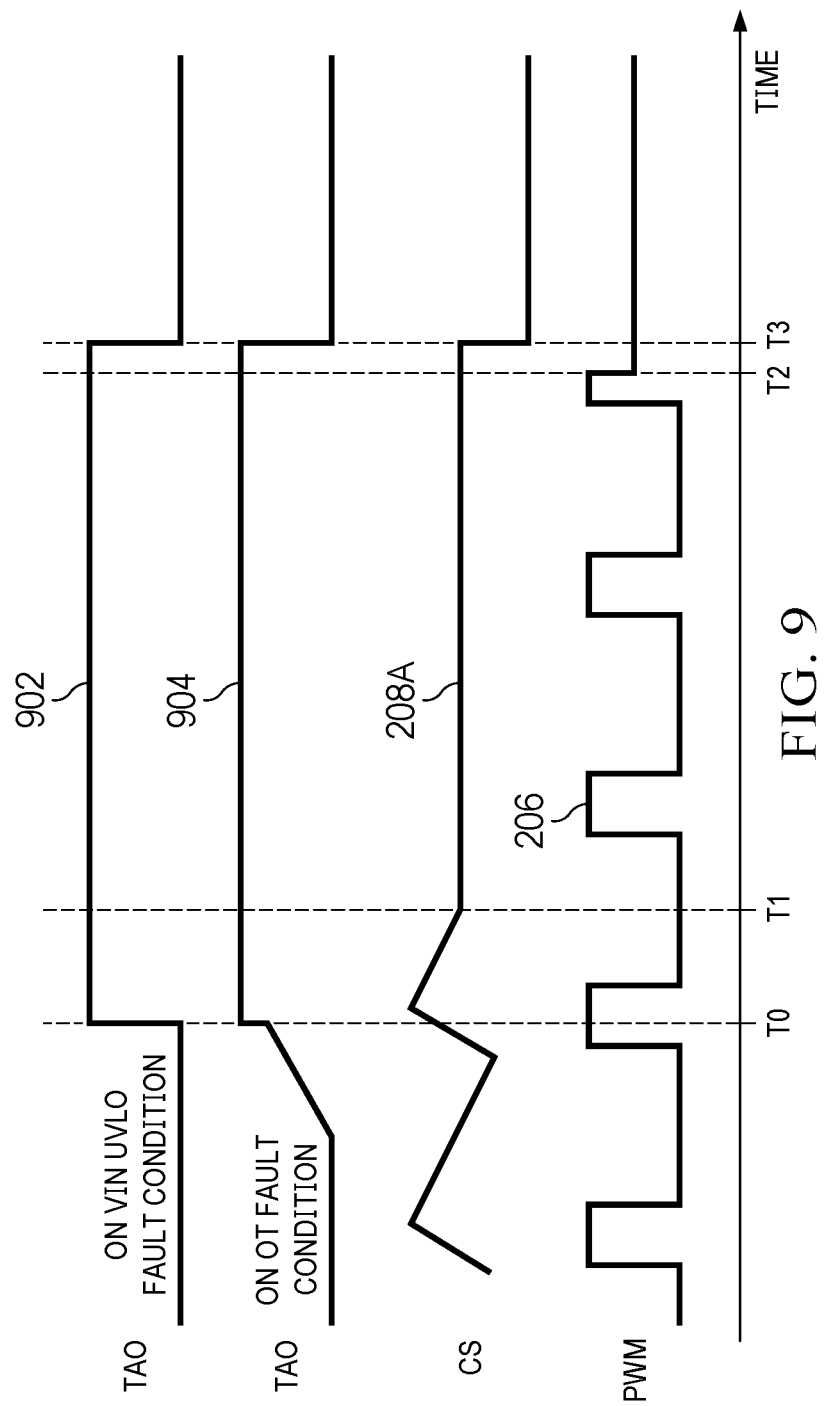
FIG. 9 is an example timing diagram representative of signals within the multi-phase buck regulator circuitry of FIG. 2 when a phase circuit exhibits a first non-catastrophic fault.

FIG. 9 is an example timing diagram representative of signals within the multi-phase buck regulator circuitry of FIG. 2 when an affected phase circuit 204A exhibits a first non-catastrophic fault. FIG. 9 includes TAO signals 902, 904, the CS signal 208A, and the PWM signals 206. The timeline of FIG. 9 also includes timestamps T0, T1, T2. The timeline of FIG. 9 is separate from the timelines described above.

The TAO signal 902 represents the voltage of the TAO signal 214 when the VIN signal 210 provided to the affected phase circuit 204A falls below a threshold voltage. In such examples, the phase circuit 204A is configured to immediately pull the TAO signal 214 up to a high supply voltage (as shown in the signal 902 at T0). Similarly, the TAO signal 904 represents the voltage of the TAO signal 214 when an over temperature (OT) fault occurs to the phase circuit 204A. In OT fault examples, the rising temperature may cause the TAO signal 214 to rise linearly to a high supply voltage (as shown in the signal 904 at T0).

Between T0 and T1 of FIG. 9, the phase circuit 204A identifies a non-catastrophic fault has occurred and transitions the CS signal 208A to the REFIN voltage. The REFIN voltage does not refer to the high supply voltage or the low supply voltage because, as described above in connection with FIGS. 3, 7, and 8, those values are used as codes to identify catastrophic faults. Rather, the REFIN voltage is a voltage in between the two operational voltages that the CS signal 208A transitions between when a fault is not present (e.g., before T0 in FIG. 9).

The fault manager circuitry 202 identifies a non-catastrophic fault an amount of time after T1, when a determination is made that the CS signal 208A is no longer transitioning between the two operational voltages and is instead remaining static at the REFIN voltage. In turn, the phase circuit 204A sends pulses in all of the PWM signals 206 between T1 and T2. While the pulses in the PWM signal 206 shown in FIG. 9 are aligned in time for simplicity, in practice, the controller circuitry 200 may send pulses to different phase circuits at different times.

The non-affected phase circuits respond normally to the pulses between T1 and T2 (i.e., providing power to the load 110 and transitioning between the two operational voltages in the corresponding CS signal(s)). In the example of FIG. 9, the fault manager circuitry 202 sends two consecutive pulses after T1 before checking the CS signals 208 to determine which phase circuits are not exhibiting a fault. In other examples, the fault manager circuitry 202 transmits a different number of pulses before checking the CS signals 208.

At T2 in FIG. 9, the CS signal 208A is still at the REFIN voltage because the affected phase circuit 204A is still experiencing a non-catastrophic faut. Accordingly, the fault manager circuitry 202 confirms the phase circuit 204A is experiencing a non-catastrophic fault and transmits a tristate voltage in the PWM signal 206A. In some examples, the fault manager circuitry 202 also identifies other phase circuits as experiencing the same non-catastrophic fault between T1 and T2. In such examples, the fault manager circuitry 202 also transmits the tristate voltage in the PWM signals of the other phase circuits experiencing the fault.

The affected phase circuit 204A identifies the tristate voltage and, at T3 in FIG. 9, pulls the TAO signal 214 and the CS signal 208A down to low supply voltages. The phase circuit 204A can use the low supply voltage at T3 of FIG. 9 because the tristate voltage confirms the fault manager circuitry 202 is looking to identify a non-catastrophic fault at that point in time. In contrast, at T2 of FIG. 7, the phase circuit 204A correctly interprets the low supply voltage as a catastrophic fault because the voltage code was identified without the phase circuit 204A previously sending a tristate voltage. In the example of FIG. 9, the time between T2 and T3 represents the time required for the affected phase circuit 204A: (1) interpret the tristate voltage, and (2) transition the TAO signal 214 and the CS signal 208A in response to the interpretation.

At T3 of FIG. 9, the affected phase circuit 204A transitions the CS signal 208A to a low supply voltage. The fault manager circuitry 202 uses the low supply voltage to determine the phase circuit 204A is exhibiting either a VDD under voltage fault or an OT fault. The fault manager circuitry 202 then performs preventative actions based on the type of fault. At T3, the affected phase circuit 204A also enables the TAO signal 214 to return to an operational voltage representative of temperature.

Figure 10:
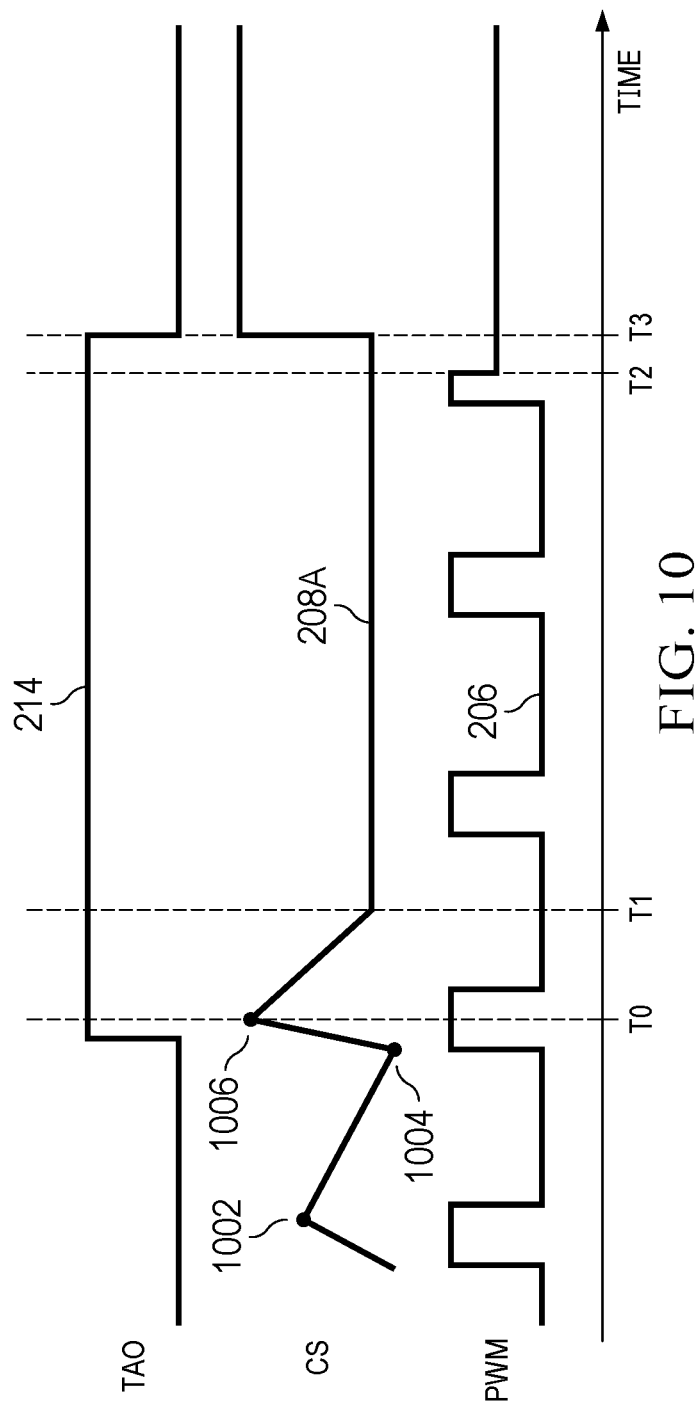
FIG. 10 is an example timing diagram representative of signals within the multi-phase buck regulator circuitry of FIG. 2 when a phase circuit exhibits a second non-catastrophic fault.

FIG. 10 is an example timing diagram representative of signals within the multi-phase buck regulator circuitry of FIG. 2 when a phase circuit exhibits a second non-catastrophic fault. FIG. 10 includes the TAO signal 214, the CS signal 208A, and the PWM signal 206A. The CS signal 208A includes data points 1002, 1004, 1006. The timeline of FIG. 10 also includes timestamps T0, T1, T2, and T3. The timeline of FIG. 9 is separate from the timelines described above.

At T0 in FIG. 10, an over current fault occurs. The over current fault causes the CS signal 208A to rise to a value above the range of voltages exhibited during normal operations (shown in FIG. 10 as the vertical difference between data points 1002 and 1006).

At T1 in FIG. 10, the affected phase circuit 204A transitions the CS signal 208A to the REFIN voltage. The REFIN voltage is between data points 1002, 1004, which are the minima and maxima voltages exhibited during normal operations.

The fault manager circuitry 202 identifies a non-catastrophic fault an amount of time after T1, when a determination is made that the CS signal 208A is no longer transitioning between the two operational voltages of data points 1002, 1004 and is instead remaining static at the REFIN voltage. In turn, the phase circuit 204A sends pulses in all of the PWM signals 206 between T1 and T2. While the pulses in the PWM signal 206 shown in FIG. 10 are aligned in time for simplicity, in practice, the controller circuitry 200 may send pulses to different phase circuits at different times.

The non-affected phase circuits respond normally to the pulses between T1 and T2 (i.e., providing power to the load 110 and transitioning between the two operational voltages in the corresponding CS signal(s)). In the example of FIG. 10, the fault manager circuitry 202 sends two consecutive pulses after T1 before checking the CS signals 208 to determine which phase circuits are not exhibiting a fault. In other examples, the fault manager circuitry 202 transmits a different number of pulses before checking the CS signals 208.

At T2 in FIG. 10, the CS signal 208A is still at the REFIN voltage because the affected phase circuit 204A is still experiencing a non-catastrophic faut. Accordingly, the fault manager circuitry 202 confirms the phase circuit 204A is experiencing a non-catastrophic fault and transmits a tristate voltage in the PWM signal 206A. In some examples, the fault manager circuitry 202 also identifies other phase circuits as experiencing the same non-catastrophic fault between T1 and T2. In such examples, the fault manager circuitry 202 also transmits the tristate voltage in the PWM signals of the other phase circuits experiencing the fault.

At T3 in FIG. 10, the affected phase circuit 204A transitions the CS signal 208A to a high supply voltage. The fault manager circuitry 202 uses the high supply voltage to determine the phase circuit 204A is exhibiting an over current fault. The fault manager circuitry 202 then performs preventative actions to mitigate or correct the over current fault. At T3, the affected phase circuit 204A also enables the TAO signal 214 to return to an operational voltage representative of temperature.

Figure 11:
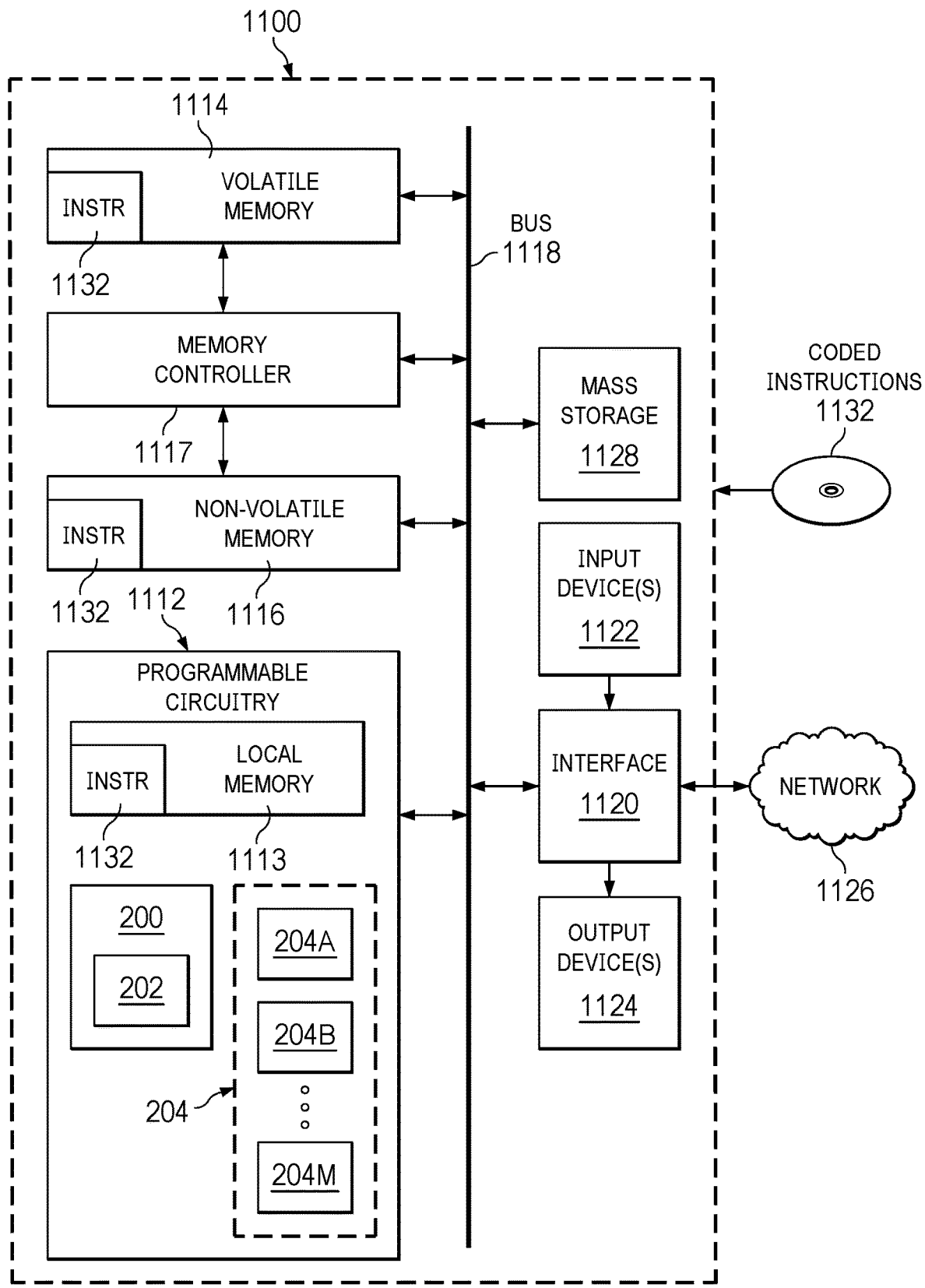
FIG. 11 is a block diagram of an example processing platform including programmable circuitry structured to execute, instantiate, and/or perform the example machine readable instructions and/or perform the example operations of FIGS. 4, 5, 6 to implement the multi-phase buck regulator circuitry of FIG. 2.

FIG. 11 is a block diagram of an example programmable circuitry platform 1100 structured to execute and/or instantiate the example machine-readable instructions and/or the example operations of FIGS. 4, 5, 6 to implement the multi-phase buck regulator circuitry 108 of FIG. 2. The programmable circuitry platform 1100 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 1100 of the illustrated example includes programmable circuitry 1112. The programmable circuitry 1112 of the illustrated example is hardware. For example, the programmable circuitry 1112 can be implemented by one or more integrated circuits, logic circuits, FPGAs, microprocessors, CPUs, GPUs, DSPs, and/or microcontrollers from any desired family or manufacturer. The programmable circuitry 1112 may be implemented by one or more semiconductor based (e.g., silicon based) devices. In this example, the programmable circuitry 1112 implements the controller circuitry 200, the fault manager circuitry 202, and the phase circuits 204.

The programmable circuitry 1112 of the illustrated example includes a local memory 1113 (e.g., a cache, registers, etc.). The programmable circuitry 1112 of the illustrated example is in communication with main memory 1114 and 1116, which includes a volatile memory 1114 and a non-volatile memory 1116, by a bus 1118. The volatile memory 1114 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1116 may be implemented by flash memory and/or any other desired type of memory device. Access to the main memory 1114 and 1116 of the illustrated example is controlled by a memory controller 1117. In some examples, the memory controller 1117 may be implemented by one or more integrated circuits, logic circuits, microcontrollers from any desired family or manufacturer, or any other type of circuitry to manage the flow of data going to and from the main memory 1114 and 1116.

The programmable circuitry platform 1100 of the illustrated example also includes interface circuitry 1120. The interface circuitry 1120 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1122 are connected to the interface circuitry 1120. The input device(s) 1122 permit(s) a user (e.g., a human user, a machine user, etc.) to enter data and/or commands into the programmable circuitry 1112. The input device(s) 1122 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1124 are also connected to the interface circuitry 1120 of the illustrated example. The output device(s) 1124 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1120 of the illustrated example, thus, typically includes a graphics driver card, a graphics driver chip, and/or graphics processor circuitry such as a GPU.

The interface circuitry 1120 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1126. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 1100 of the illustrated example also includes one or more mass storage discs or devices 1128 to store firmware, software, and/or data. Examples of such mass storage discs or devices 1128 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine readable instructions 1132, which may be implemented by the machine readable instructions of FIGS. 4, 5, 6, may be stored in the mass storage device 1128, in the volatile memory 1114, in the non-volatile memory 1116, and/or on at least one non-transitory computer readable storage medium such as a CD or DVD which may be removable.

The machine readable instructions discussed above may be embodied in instructions (e.g., software and/or firmware) stored on one or more non-transitory computer readable and/or machine readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 4, 5, 6, many other methods of implementing the example multi-phase buck regulator circuitry 108 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine readable instructions may be fragmented and stored on one or more storage devices, disks and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of computer-executable and/or machine executable instructions that implement one or more functions and/or operations that may together form a program such as that described herein.

In another example, the machine readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable, computer readable and/or machine readable media, as used herein, may include instructions and/or program(s) regardless of the particular format or state of the machine readable instructions and/or program(s).

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 4, 5, 6 may be implemented using executable instructions (e.g., computer readable and/or machine readable instructions) stored on one or more non-transitory computer readable and/or machine readable media. As used herein, the terms non-transitory computer readable medium, non-transitory computer readable storage medium, non-transitory machine readable medium, and/or non-transitory machine readable storage medium are expressly defined to include any type of computer readable storage device and/or storage disk and to exclude propagating signals and to exclude transmission media. Examples of such non-transitory computer readable medium, non-transitory computer readable storage medium, non-transitory machine readable medium, and/or non-transitory machine readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B. (5) A with C. (6) B with C, or (7) A with B and with C. As used herein in the context of describing structures, components, items, objects and/or things, the phrase "at least one of A and B" is intended to refer to implementations including any of (1) at least one A. (2) at least one B, or (3) at least one A and at least one B. Similarly, as used herein in the context of describing structures, components, items, objects and/or things, the phrase "at least one of A or B" is intended to refer to implementations including any of (1) at least one A. (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A. (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

In this description, the term "and/or" (when used in a form such as A, B and/or C) refers to any combination or subset of A, B, C, such as: (a) A alone; (b) B alone; (c) C alone; (d) A with B; (c) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

Numerical identifiers such as "first", "second", "third", etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that enable phase circuits to provide location and type information of faults using only a shared TAO signal and individual CS signals. Described systems, apparatus, articles of manufacture, and methods improve the efficiency of using a computing device by configuring a phase circuit 204A affected by a fault to change an individual CS signal and/or a shared TAO signal to a predetermined voltage based on the type of fault. The example fault manager circuitry 202 is configured to interpret the pre-determined voltages as codes to determine the location and type of the fault. The example controller circuitry 200 is then configured to perform preventative actions based on the location and type of the fault. Described systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

What is claimed is:

1. A phase circuit configured to:
receive a pulse in a pulse width module (PWM) signal;
provide, after receiving the pulse, an output voltage to a load;
exhibit a fault;
in response to the fault corresponding to a first category, transmit a first code voltage in a current sense (CS) signal;
in response to the fault corresponding to a second category, transmit a reference voltage in the CS signal;
receive, after transmission of the reference voltage, a tristate voltage in the PWM signal; and
transmit, after receiving the tristate voltage, a second code voltage in the CS signal based on a type of the fault and the second category.

2. The phase circuit of claim 1, wherein:
the phase circuit is a first phase circuit;
the PWM signal is received from a controller circuit;
the CS signal is transmitted to the controller circuit; and
the controller circuit is also in communication with a second phase circuit.

3. The phase circuit of claim 1, further configured to:
transmit, before experiencing the fault, an operational voltage in a thermal analog output (TAO) signal, wherein the operational voltage is within a threshold range;
transmit, after experiencing the fault, a third code voltage in the TAO signal, wherein the second code voltage is outside a threshold range; and
return, after transmitting either the first code voltage or the second code voltage in the CS signal, transmission of the operational voltage in the TAO signal.

4. The phase circuit of claim 1, wherein:
the first category corresponds to catastrophic faults; and
the second category of corresponds to non-catastrophic faults.

5. The phase circuit of claim 1, wherein:
the fault is a Drain Power Voltage Under Voltage (VDD UVLO) fault in the first category; and
the first code voltage is a low supply voltage; and
the phase circuit does not transmit the second code voltage.

6. The phase circuit of claim 1, wherein:
the fault is an Input Voltage Under Voltage (VIN UVLO) fault or an Over Temperature (OT) fault in the second category;
the first code voltage is a reference voltage; and
the second code voltage is a low supply voltage.

7. The phase circuit of claim 1, wherein:
the fault is an Over Current (OC) fault in the second category;
the first code voltage is a reference voltage; and
the second code voltage is a high supply voltage.

8. The phase circuit of claim 1, wherein:
the fault is a High Side Short (HSS) fault in the first category;
the first code voltage is a high supply voltage; and
the phase circuit does not transmit the second code voltage.

9. A controller circuit comprising:
interface circuitry to communicate with a first phase circuit and a second phase circuit;
non-transitory machine-readable storage medium storing machine-readable instructions; and
programmable circuitry to instantiate or execute the machine-readable instructions to:
receive a first code voltage from a first current sense (CS) signal, the first code voltage to indicate one of the first phase circuit or the second phase circuit has exhibited a fault;
determine, based on the first CS signal, whether the fault is in a first category of faults exhibited by the first phase circuit;
determine, based on a second CS signal, whether the fault is the first category of faults exhibited by the second phase circuit;
in response to neither the first phase circuit nor the second phase circuit experiencing the first category of faults, transmit a first pulse in a first pulse width module (PWM) signal to the first phase circuit and a second pulse in a second PWM signal to the second phase circuit;
transmit, after the first pulse and the second pulse, a tristate voltage in the first PWM signal to the first phase circuit;
receive a second code voltage in the first CS signal;
determine, after transmitting the tristate voltage, a type of the fault within a second category of faults exhibited based on the second code voltage;
determine the first phase circuit exhibited the fault based on the second code voltage occurring in the first CS signal; and
perform preventative actions to the first phase circuit based on the type of the fault.

10. The controller circuit of claim 9, wherein the machine-readable instructions cause the programmable circuitry to receive, after identifying a location and the type of fault, a second code voltage in a thermal analog output (TAO) signal, the second code voltage to indicate the fault has been resolved.

11. The controller circuit of claim 9, wherein:
the first category corresponds to catastrophic faults; and
the second category corresponds to non-catastrophic faults.

12. The controller circuit of claim 9, wherein:
the fault is a Drain Power Voltage Under Voltage (VDD UVLO) fault in the first category; and
the first code voltage is a low supply voltage; and
the controller circuit does not transmit the first pulse or second pulse.

13. The controller circuit of claim 9, wherein:
the fault is an Input Voltage Under Voltage (VIN UVLO) fault or an Over Temperature (OT) fault in the second category;
the first code voltage is a reference voltage; and
the second code voltage is a low supply voltage.

14. The controller circuit of claim 9, wherein:
the fault is an Over Current (OC) fault in the second category;
the first code voltage is a reference voltage; and
the second code voltage is a high supply voltage.

15. The controller circuit of claim 9, wherein:
the fault is a High Side Short (HSS) fault in the first category;
the first code voltage is a high supply voltage; and
the controller circuit does not transmit the first pulse or second pulse.

16. The controller circuit of claim 9, wherein the programmable circuitry includes one or more of:
at least one of a central processor unit, a graphics processor unit, or a digital signal processor, the at least one of the central processor unit, the graphics processor unit, or the digital signal processor having control circuitry to control data movement within the programmable circuitry, arithmetic and logic circuitry to perform one or more first operations corresponding to machine-readable data, and one or more registers to store a result of the one or more first operations, the machine-readable data in the controller circuit;
a Field Programmable Gate Array (FPGA), the FPGA including logic gate circuitry, a plurality of configurable interconnections, and storage circuitry, the logic gate circuitry and the plurality of the configurable interconnections to perform one or more second operations, the storage circuitry to store a result of the one or more second operations; or
Application Specific Integrated Circuitry (ASIC) including logic gate circuitry to perform one or more third operations.

17. A system comprising:
a first phase circuit configured to transmit a first current sense (CS) signal to controller circuitry;
a second phase circuit configured to transmit a second CS signal to the controller circuitry;
the controller circuitry configured to:
  receive a first code voltage from the first CS signal, the first code voltage to indicate one of the first phase circuit or the second phase circuit has exhibited a fault;
  determine, based on the first CS signal, whether the fault is in a first category of faults exhibited by the first phase circuit;
  determine, based on a second CS signal, whether the fault is the first category of faults exhibited by the second phase circuit;
  in response to neither the first phase circuit nor the second phase circuit experiencing the first category of faults, transmit a first pulse in a first pulse width module (PWM) signal to the first phase circuit and a second pulse in a second PWM signal to the second phase circuit;
  transmit, after the first pulse and the second pulse, a tristate voltage in the first PWM signal to the first phase circuit;
  receive a second code voltage in the first CS signal;
  determine, after transmitting the tristate voltage, a type of the fault within a second category of faults exhibited based on the second code voltage;
  determine the first phase circuit exhibited the fault based on the second code voltage occurring in the first CS signal; and
  perform preventative actions to the first phase circuit based on the type of the fault.

18. The system of claim 17, wherein:
the controller circuitry further is configured to receive a thermal analog output (TAO) signal on an input terminal connected to both the first phase circuit and the second phase circuit; and
the first phase circuit is configured to:
transmit, before experiencing the fault, an operational voltage in the TAO signal, wherein the operational voltage is within a threshold range;
transmit, after experiencing the fault, a second code voltage in the TAO signal, wherein the second code voltage is outside the threshold range; and
return, after transmitting either the first code voltage or the second code voltage in the CS signal, transmission of the operational voltage in the TAO signal.

19. The system of claim 17, wherein:
the first category corresponds to catastrophic faults; and
the second category of corresponds to non-catastrophic faults.

20. The system of claim 17, wherein:
the fault is a Drain Power Voltage Under Voltage (VDD UVLO) fault in the first category;
the first code voltage is a low supply voltage; and
the first phase circuit does not transmit the second code voltage.

\* \* \* \* \*